(12) United States Patent
Pfefferlein et al.

(10) Patent No.: US 10,191,091 B2
(45) Date of Patent: Jan. 29, 2019

(54) CIRCUIT BOARD WITH IMPLANTED OPTICAL CURRENT SENSOR

(71) Applicant: SIEMENS AKTIENGESELLSCHAFT, Munich (DE)

(72) Inventors: Stefan Pfefferlein, Heroldsberg (DE); Ulrich Wetzel, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 15/882,273

(22) Filed: Jan. 29, 2018

(65) Prior Publication Data

US 2018/0217186 A1 Aug. 2, 2018

(30) Foreign Application Priority Data

Feb. 1, 2017 (EP) .................................... 17154199

(51) Int. Cl.
    *G01R 15/24* (2006.01)
    *G02B 6/42* (2006.01)
    (Continued)

(52) U.S. Cl.
    CPC .......... *G01R 15/246* (2013.01); *G01R 15/24* (2013.01); *G01R 33/0322* (2013.01);
    (Continued)

(58) Field of Classification Search
None
See application file for complete search history.

(56) References Cited

U.S. PATENT DOCUMENTS

| | | | | |
|---|---|---|---|---|
| 3,605,013 A | * | 9/1971 | Yoshikawa | .......... G01R 15/246 |
| | | | | 324/96 |
| 3,746,983 A | * | 7/1973 | Renz | .................... G01R 15/246 |
| | | | | 324/96 |

(Continued)

FOREIGN PATENT DOCUMENTS

| | | |
|---|---|---|
| DE | 10 000 306 | 7/2001 |
| JP | 63-168570 A * | 7/1988 |
| JP | 2013/152225 | 8/2013 |

OTHER PUBLICATIONS

P. Caselitz et al, "ISET, Drehzahlvariable Windkraftanlagen mit Überlagerungsgetriebe", Wind Kraft Journal, pp. 40-41.

*Primary Examiner* — Mike Stahl
(74) *Attorney, Agent, or Firm* — Cozen O'Connor

(57) ABSTRACT

A circuit board with a conductor path having a recess, an implant with left, right, lower and upper edges arranged in the recess, where the implant has first and second optical layers, a second optical layer and a conductor arranged between them, the first and the second optical layer each have at least one light-conducting structure with first and second ends, where a light-conductor is arranged in a right edge of the implant, in which respective second ends of the light-conducting structures are located, such that light fed in at the first end of the optical fiber of the first optical layer is deflected to the second end of the light-conducting structure of the second optical layer such that a beam path of the light encompasses the conductor, and the circuit also includes an optical transmitter and an optical receiver with and evaluator that form a fiber optic current sensor.

7 Claims, 3 Drawing Sheets

(51) Int. Cl.
*H05K 1/02* (2006.01)
*G01R 33/032* (2006.01)
*G02B 6/12* (2006.01)

(52) U.S. Cl.
CPC ......... *G02B 6/4214* (2013.01); *H05K 1/0274* (2013.01); *G02B 2006/12111* (2013.01); *G02B 2006/12138* (2013.01)

(56) References Cited

U.S. PATENT DOCUMENTS

| | | | | |
|---|---|---|---|---|
| 4,564,754 A | * | 1/1986 | Sato | G01R 15/246 250/225 |
| 5,304,920 A | * | 4/1994 | Stierlin | G02B 6/12004 324/117 R |
| 5,488,291 A | * | 1/1996 | Koide | G01R 15/246 29/592.1 |
| 5,583,428 A | * | 12/1996 | Meier | G01R 15/246 324/244.1 |
| 7,295,725 B1 | | 11/2007 | Wu et al. | |
| 2001/0050551 A1 | | 12/2001 | Bohnert et al. | |
| 2012/0121216 A1 | * | 5/2012 | Oh | G01R 15/246 385/1 |

* cited by examiner

CIRCUIT BOARD WITH IMPLANTED OPTICAL CURRENT SENSOR

BACKGROUND OF THE INVENTION

1. Field of the Invention

The invention relates to a circuit board with a conductor path having a recess which is arranged along the conductor path such that the conductor path is interrupted, where an implant with left, right, lower and upper edges is arranged in the recess, and where the implant serves to measure the current flowing in the conductor path.

2. Description of the Related Art

When measuring current and voltage in assemblies for power electronics, such as inverters, there are often electromagnetic compatibility problems as a result of strong electromagnetic fields and temporal changes in the high currents when operating with alternating current. Depending on a previously known measurement method, such as a shunt, or an XMR method, the effort in order to achieve sufficient measurement accuracy for a current measurement is considerable. For example, magnetic centering of the flux density in soft magnetic cores influences a current measurement in two respects. On the one hand, an additional inductance is thereby introduced into the circuit for measurement such that the original current paths are changed. On the other hand, in the case of high frequency currents, such great losses can occur in the core that a measurement is only possible briefly or not at all.

Moreover, in the case of current measurements with shunt resistors, a greater power loss is also to be expected, which must possibly also be dissipated via a corresponding cooling effort and thus impairs system efficiency.

Furthermore, in the case of electromagnetic measurement with iron cores or coils, the fact that assembly space present on the circuit board is usually only limited presents a problem.

Published patent application DE 100 00 306 A1 discloses a fiber optic current sensor. This fiber optic current sensor operates with the magneto-optical or Faraday effect. Due to the magnetic field, a light transmitted through a fiber optic conductor is phase-shifted. The phase shift is proportional to the current and can be measured.

The design and dimensions of conventional fiber optic current sensors, such as for example a fiber optic current sensor available from the company ABB are much too large for use on a circuit board. There is also a ring-shaped fiber optic current sensor from Phoenix Contact that is clamped on a top-hat rail, and through which a cable must be guided. This is also unsuitable for use on a circuit board.

SUMMARY OF THE INVENTION

In view of the foregoing, it is therefore an object of the present invention to provide a device for current measurement which is particularly resistant to interference from electromagnetic influences, only occupies a minimum assembly space in a device and/or on a circuit board and does not significantly affect system efficiency.

This and other objects and advantages are achieved in accordance with the invention by an implant that is arranged in the circuit board. The implant has a conductor which, with the implant inserted into the circuit board, closes the conductor path separated by the recess, where the implant has a first optical layer and a second optical layer, and the conductor is arranged between these two layers, the first and the second optical layer each have at least one light-conducting structure with a first end and a second end, where a light-conductor is arranged in a right edge region of the implant in which the respective second ends of the light-conducting structures are located so that light fed in at the first end of the light-conducting structure of the first optical layer is deflected to the second end of the light-conducting structure of the second optical layer so that a beam path of the light encompasses the conductor. The implant or the circuit board additionally has an optical transmitter and an optical receiver with an evaluator whereby a fiber optic current sensor for current measurement of a current flowing through the conductor is formed. The evaluator is configured to determine the phase shift between the transmitted and the received light.

The implant now provides a contactless current measurement device that is embedded within a conductor path. In accordance with the invention, the technology of three-dimensional electro-optical circuit boards (EOCB) is used for the implant. For the integration of optical transmission paths into the implant and/or into the EOCB circuit board used for the implant, for example, fully integrated window films are integrated. These window films are suitable for integrating light-conducting structures therein. With these light-conducting structures integrated into the circuit board and/or the implant, a fiber optic sensor has been realized as a circuit board assembly. The light-conducting structures can be advantageously realized in accordance with the method of refractive index modification via laser in transparent materials.

With the invention, it is now readily possible to emulate the conductor-encompassing fibers necessary for the fiber optic current measurement principle as an EOCB with integrated light-conducting structures and to use this structure for contactless and feedback-free current measurement. In doing so, sections of an existing circuit board can be used for current measurement by integrating an EOCB implant into a customary circuit board.

A piece is therefore advantageously removed from a piece of a conductor path that exists anyway and is replaced by a piece of conductor assembled as an EOCB with light-conducting structures. This EOCB formed as an implant is also configured as an optical current sensor that operates in accordance with the Faraday effect for the measurement of electric current.

In a further embodiment, a further light-conductor is also arranged in the left edge region of the implant and/or the circuit board and the first and the second optical layers have a plurality of light-conducting structures, where the respective ends of the light-conducting structure are coupled via the light-conductors and the beam path of the light thereby encompasses the conductor in a winding manner.

In a further embodiment, the first ends and the second ends are each arranged flush with the left edge region and/or the right edge region and the light-conductors each have a trapezoidal profile; in the process the longer base side of the trapezoid is arranged toward the ends and thereby a total reflection can occur for the beam path on the arms inside the trapezoid of the light-conductors.

In another alternative embodiment, the first ends and the second ends are beveled for a total reflection and are each arranged beyond the left edge region and/or the right edge region and the light-conductors each have a rectangular profile, and are arranged between the first ends and the second ends.

In order, for example, to electrically fasten the implant to the circuit board securely, an outer contour of the lower and upper edge of the implant and/or an inner contour of the edge of the assigned recess has a periodically recurring structure, in particular a serrated, jagged or undulating structure, where the structure is preferably metallically coated and can be electrically connected to the circuit board in a reflow process.

With regard to the aforementioned problem of current measurement for power electronics, the aforementioned object is also achieved by an inverter with a circuit board in accordance with the disclosed embodiments.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawings show an exemplary embodiment of the invention in which.

DETAILED DESCRIPTION OF THE EXEMPLARY EMBODIMENTS

Figure 1:
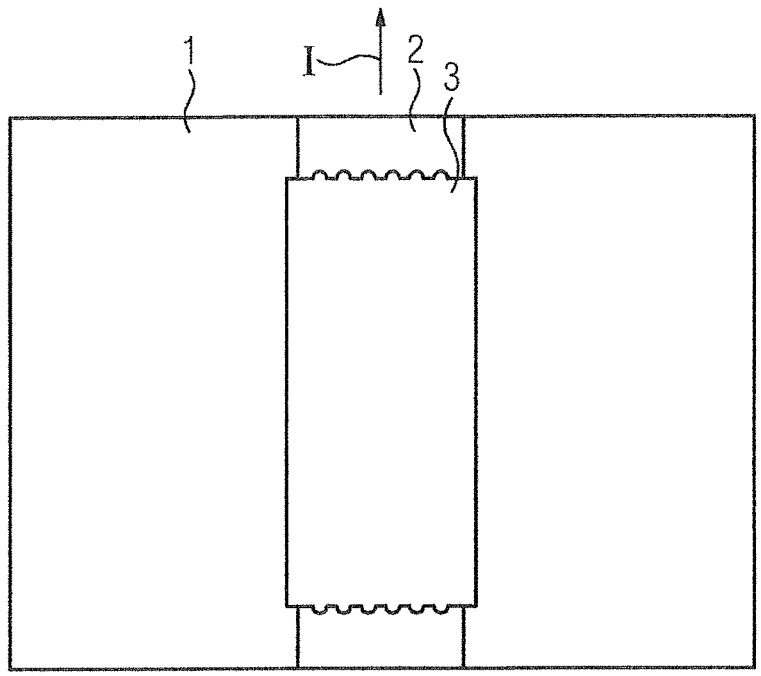
FIG. 1 shows a circuit board with a recess in accordance with the invention.

In accordance with FIG. 1, a circuit board 1 with a conductor path 2 is shown. The conductor path 2 serves to conduct a current I. To integrate a current measurement device into the circuit board 1, the circuit board has a recess 3 that is arranged along the path of the conductor path 2 such that the conductor path 2 is interrupted, where a current measurement using the implant 4 is subsequently possible in the implant 4 inserted in the recess 3.

Figure 2:
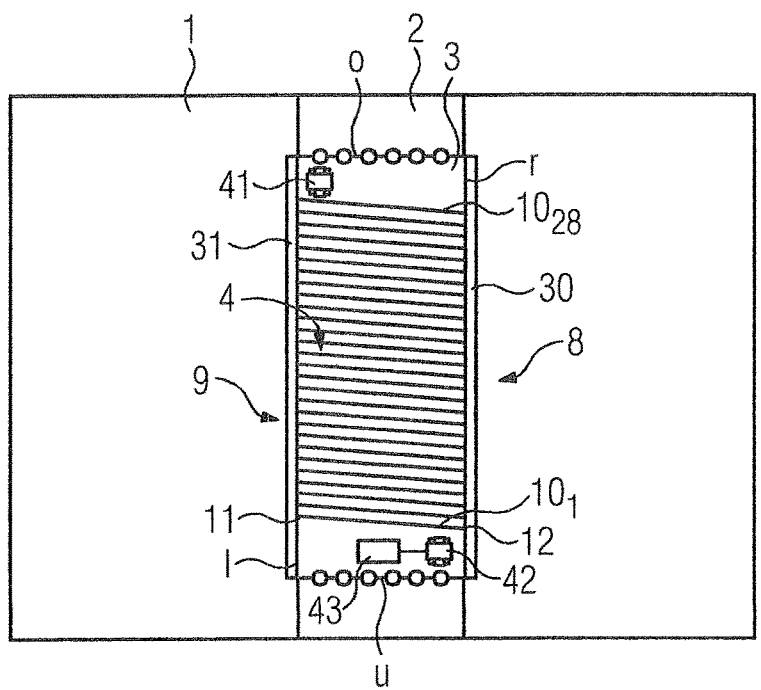
FIG. 2 shows the circuit board of FIG. 1 with an implant inserted in the recess in accordance with the invention.

FIG. 2 shows the circuit board 1 of FIG. 1 with the implant 4 arranged in the recess 3. The implant 4 has a left l, a right r, lower u and upper edge o. The implant 4 is provided with a conductor 5 (see FIG. 3) which, with the inserted implant 4, closes the conductor path 2 separated by a recess 3 for a current flow. The implant 4 has a first optical layer 6 and a second optical layer 7, and the conductor 5 is arranged between the two layers 6,7. The first and the second optical layer 6,7 each have a plurality of light-conducting structures $10_1, \ldots, 10_{28}$.

In accordance with FIG. 2, the implant 4 can only be seen from the upper side. The lower side of the implant 4 also has a plurality of light-conducting structures $20_1, \ldots, 20_{28}$. The light-conducting structures $10_1, \ldots, 10_{28}$ and $20_1, \ldots, 20_{28}$ are arranged as optical fiber channels in thin sheet glass of an EOCB circuit board, where the thin sheet glass represents the optical layers 6,7.

A light-conducting means 30 is arranged in a right edge region 8 of the implant 4, in which the respective second ends 12 of the light-conducting structures are located, so that a light fed in at the first end 11 of a light-conducting structure $10_1$ of the first optical layer 6 is deflected to the second end 12 of the light-conducting structure $20_1$ of the second optical layer 7 so that a beam path 40 of the light encompasses the conductor 5. In addition, a further light-conductor 31 is arranged in a left edge region 9 to couple the plurality of the light-conducting structures of the first and second optical layers to each other. With the aid of the light-conductors 30,31, the plurality of the light-conducting structures is therefore optically coupled such that the beam path of the light encompasses the conductor 5 several times like a winding.

An optical transmitter 41 and an optical receiver 42 with an evaluator 43 are arranged on the implant 4, whereby a fiber optic current sensor for current measurement of a current flowing through the conductor 5 is formed.

Figure 3:
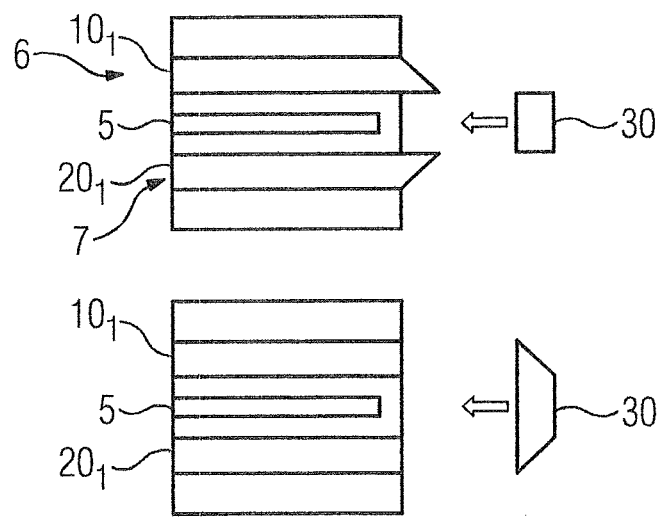
FIG. 3 shows a sectional view of the implant of FIG. 2 with a view of the optical layers.

As shown in FIG. 3, possible arrangements for a deflection of the beam path via the light-conducting means 30,31 are shown. In the upper embodiment, the first ends and the second ends are beveled for a total reflection and are each arranged beyond the left and/or right edge region 8 and the light-conductors each have a rectangular profile are arranged between the first ends 11 and the second ends 12.

In the lower embodiment, the first ends 11 and the second ends 12 are each arranged flush with the left edge region 8 and/or the right edge region (wherein in FIG. 3, in each case only the right edge region 8 is ever shown) and the light-conduct 30,31 each have a trapezoidal profile, where the longer base side of the trapezoid is arranged toward the ends so that a total reflection can occur for the beam path on the arms of the trapezoid inside the light-conductors 30,31.

Figure 4:
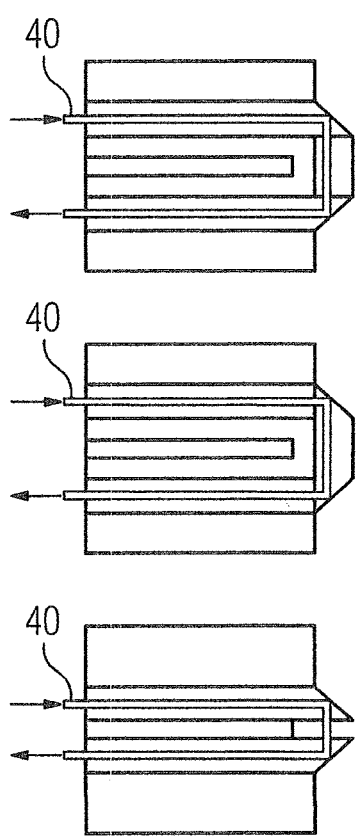
FIG. 4 shows a sectional view of the implant to record the deflection of the beam path.

FIG. 4 again shows the principle of the deflection of the beam path inside the circuit board. Based on an EOCB circuit board, in other words, a circuit board with integrated thin glass layer light-conducting structures, by applying a trapezoid to the first layer 6 and the second layer 7, a ray of light fed into the light-conducting structure can be deflected from the first layer 6 into the second layer 7. The upper embodiment shows a deflection by a rectangular profile and the central embodiment shows a deflection by a trapezoidal profile, where the lower embodiment does not need any means of deflection because here the first optical layer 6 and the second optical layer 7 are arranged close to each other, such that with beveled ends of the light-conducting structures the light is thus decoupled and coupled again.

Figure 5:
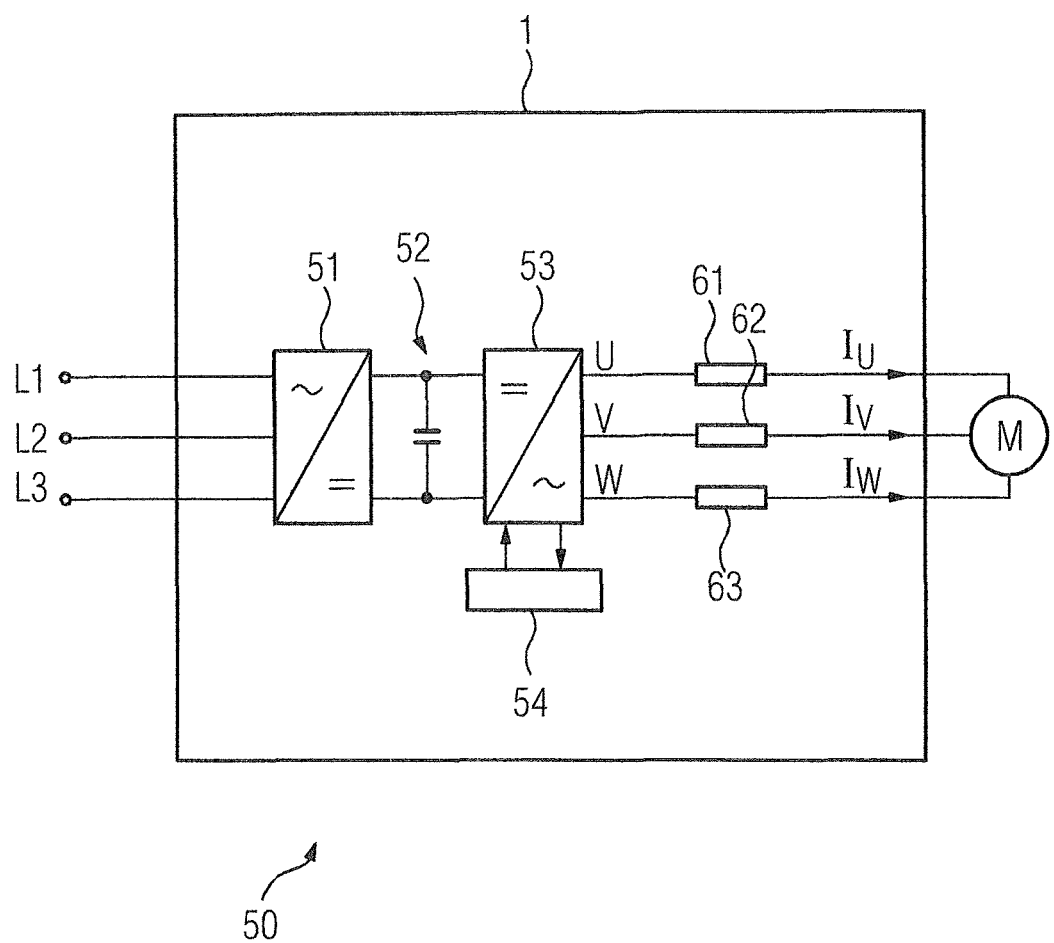
FIG. 5 is an inverter with current measurement devices integrated into the circuit board in accordance with the invention.

The implant in accordance with the invention formed as a fiber optic sensor can be advantageously inserted into an inverter 50 shown in FIG. 5. The inverter 50 is a three-phase inverter L1,L2,L3 and can control a motor M via three lines U,V,W. The inverter 50 has a rectifier/mains filter 51, an intermediate circuit 52, a power inverter 53 and an electronic control system 54. In accordance with the invention, between the power inverter 53 and the motor M to be controlled, a first current measuring system 61, a second current measuring system 62 and a third current measuring system 63 respectively is integrated into the circuit board 1 for each line U,V,W. The current measuring systems 61,62, 63 are formed respectively as the aforementioned implant 4.

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A circuit board with a conductor path having a recess which is arranged along the conductor path such that the conductor path is interrupted, an implant with a left, right, lower and upper edge being arranged in the recess, the circuit board comprising:
   a conductor arranged in the implant which, with the implant inserted, closes the conductor path separated by the recess, the implant having a first optical layer and a second optical layer and the conductor being arranged between the first and the second optical layers, and the first and the second optical layer each having at least one light-conducting structure with a first end and a second end;
   a light-conductor arranged in a right edge region of the implant in which respective second ends of the light-conducting structures are located such that light fed in at the first end of the light-conducting structure of the first optical layer is deflected to the second end of the light-conducting structure of the second optical layer and such that a beam path of the light encompasses the conductor;
   an optical transmitter; and
   an optical receiver with evaluator;
   wherein the optical transmitter and optical receiver form a fiber optic current sensor for current measurement of a current flowing through the conductor.

2. The circuit board as claimed in claim 1, further comprising:
   a further light-conductor arranged in a left edge region, the first and the second optical layers having a plurality of light-conducting structures;
   wherein respective first and second ends of the light-conducting structures being coupled via the light-conductor and the further light-conductor such that the beam path of the light encompasses the conductor in a winding manner.

3. The circuit board as claimed in claim 2, wherein the first ends and the second ends are each flush with at least one of (i) the left edge region and (ii) the right edge region, and the light-conductor and further light-conductor have a trapezoidal profile in which a longer base side of the trapezoid is arranged toward the first and second ends such that a total reflection occurs for the beam path on arms inside the light-conductor and further light-conductor.

4. The circuit board as claimed in claim 2, wherein the first and second ends are beveled to provide a total reflection and are each arranged beyond at least one of (i) the left edge region and (ii) the right edge region, and the light-conductor and the further light-conductor each have a rectangular profile and are arranged between the first ends and the second ends.

5. The circuit board as claimed in claim 1, wherein at least one of (i) an outer contour of the lower and upper edge of the implant and (ii) an inner contour of the edge of an assigned recess has a periodically recurring structure.

6. The circuit board as claimed in claim 1, wherein the periodically recurring structure is one of serrated, jagged and or undulating.

7. An inverter comprising:
   a circuit board including a conductor path having a recess which is arranged along the conductor path such that the conductor path is interrupted, an implant with a left, right, lower and upper edge being arranged in the recess,
   wherein the circuit board comprises:
      a conductor arranged in the implant which, with the implant inserted, closes the conductor path separated by the recess, the implant having a first optical layer and a second optical layer and the conductor being arranged between the first and the second optical layers, and the first and the second optical layer each having at least one light-conducting structure with a first end and a second end;
      a light-conductor arranged in a right edge region of the implant in which respective second ends of the light-conducting structures are located such that light fed in at the first end of the light-conducting structure of the first optical layer is deflected to the second end of the light-conducting structure of the second optical layer and such that a beam path of the light encompasses the conductor;
   an optical transmitter; and
   an optical receiver with evaluator; and
   wherein the optical transmitter and optical receiver form a fiber optic current sensor for current measurement of a current flowing through the conductor.

* * * * *